United States Patent [19]
Proebsting

[11] Patent Number: 5,305,274
[45] Date of Patent: Apr. 19, 1994

[54] METHOD AND APPARATUS FOR REFRESHING A DYNAMIC RANDOM ACCESS MEMORY

[76] Inventor: Robert J. Proebsting, 27800 Edgerton Rd., Los Altos Hills, Calif. 94022

[21] Appl. No.: 945,563

[22] Filed: Sep. 16, 1992

[51] Int. Cl.[5] .......................................... G11C 11/401
[52] U.S. Cl. ................................ 365/222; 365/230.03
[58] Field of Search ............... 365/222, 189.01, 230.03

[56] References Cited
U.S. PATENT DOCUMENTS

| | | |
|---|---|---|
| 4,079,462 | 3/1978 | Koo . |
| 4,486,860 | 12/1984 | Takemae et al. .............. 365/222 |
| 4,914,630 | 4/1990 | Fujishima et al. ............. 365/222 |
| 4,934,826 | 6/1990 | Miyatake et al. ........... 365/189.01 |

FOREIGN PATENT DOCUMENTS

| | | | |
|---|---|---|---|
| 3-59876 | 3/1991 | Japan | 365/222 |
| 3-266292 | 11/1991 | Japan | 365/222 |
| 4-19896 | 1/1992 | Japan | 365/222 |
| 4-232689 | 8/1992 | Japan | 365/222 |

*Primary Examiner*—Eugene R. LaRoche
*Assistant Examiner*—Tan Nguyen
*Attorney, Agent, or Firm*—Townsend and Townsend Khourie and Crew

[57] ABSTRACT

A mode control circuit receives a row address strobe signal and a column address strobe signal and generates a normal mode signal when the row address strobe signal is received before the column address strobe signal is received. The mode control circuit generates a refresh mode signal when the row address strobe signal is received not before the column address strobe signal is received. A row addressing circuit addresses a first number of rows of data in response to the normal mode signal and a second, greater number of rows of data in response to the refresh mode signal.

16 Claims, 3 Drawing Sheets

METHOD AND APPARATUS FOR REFRESHING A DYNAMIC RANDOM ACCESS MEMORY

BACKGROUND OF THE INVENTION

The present invention is directed to computer memories and, more particularly, to a method and apparatus for refreshing a dynamic random access memory (DRAM).

FIG. 1 is a schematic diagram of a typical DRAM memory cell 10 coupled to a sense amplifier 22. Memory cell 10 includes a capacitance 14 and an FET (NMOS) transistor 18. NMOS transistor 18 has a gate terminal 34 coupled to a word line 38, a first current flowing terminal 30 coupled to a terminal 26 of capacitance 14, and a second current flowing terminal 42 coupled to a bit line 46. The other terminal of capacitance 14 is coupled to a fixed voltage $V_x$. Bit line 46 is coupled to one input terminal 50 of sense amplifier 22. Another input terminal 54 of sense amplifier 22 is coupled for receiving a reference voltage potential ($V_{ref}$). Sense amplifier 22 also includes a feedback line 58 coupled to bit line 46. The data stored in memory cell 10 is determined by the charge on capacitance 14. For example, a +5 volt signal on terminal 26 may indicate a "1," and a 0 volt signal on terminal 26 may indicate a "0."

To read the data stored in memory cell 10, a signal is provided on word line 38 for turning on NMOS transistor 18 and communicating charge between capacitance 14 and bit line 46. The capacitance of bit line 46 typically is much larger than that of capacitance 14, so the voltage on bit line 46 changes only slightly. For example, if terminal 26 of capacitance 14 is at +5 volts, and if bit line 46 is initially at +2.5 volts, then, when NMOS transistor 18 turns on, the voltage on bit line 46 may rise to approximately +2.6 volts. On the other hand, if terminal 26 of capacitance 14 is at 0 volts, then, when NMOS transistor 18 turns on, the voltage on bit line 46 may fall to approximately +2.4 volts. The voltage on bit line 46 is then compared by sense amp 22 to the reference voltage applied to input terminal 54. The reference voltage may be, for example, +2.5 volts. If the voltage on bit line 46 is above the reference voltage, then a +5 volt signal is provided on feedback line 58 for raising the voltage on bit line 46 to +5 volts, thus restoring the signal on terminal 26 of capacitance 14 to +5 volts. Of course, word line 38 must be above +5 volts to charge node 30 to +5 volts. On the other hand, if the voltage on bit line 46 is less than the reference voltage, then a 0 volt signal is provided on feedback line 58 for lowering the voltage on bit line 46 to 0 volts, thus restoring the signal on terminal 26 of capacitance 14 to 0 volts. In any event, the resulting voltage on bit line 46 indicates the value of the data stored in the memory cell to the rest of the system, and the cell voltage is returned to its original condition.

Since the charge on capacitance 14 is used to indicate the value of the data stored in each memory cell 10, and since undesired leakage current slowly discharges each memory cell, it is necessary to ensure that the charge does not dissipate to a level which causes improper operation of sense amp 22. To maintain the charge at the proper level, a special cycle, termed a "refresh cycle," is performed to periodically restore the charge on capacitance 14 of all cells sharing a common word line. The refresh cycle can be simply a normal read or write cycle. That is, a signal is provided on word line 38 for turning on NMOS transistor 18, followed by sense amp 22 generating the +5 volt or 0 volt signal on bit line 46 for restoring the (previously somewhat decayed) charge on capacitance 14.

FIG. 2 is block diagram of a typical DRAM 70 which incorporates a plurality of the memory cells 10 shown in FIG. 1. DRAM 70 includes a plurality, e.g., 16 memory arrays 74A-P, a decode circuit 78, an internal signal generator 82, a multiplexer 86, and a row refresh address counter 90. Each memory array 74A-P includes a plurality of memory cells 10, each located at the intersection of word lines 38A-P and bit lines 46A-P. Only one word line and one bit line are shown for each array, and the corresponding FET transistors and capacitances are not shown for clarity. In this embodiment, there are 256 word lines and 1024 bit lines coupled to each word line per array. Thus, DRAM 70 has a total of 4,194,304 memory cells.

Internal signal generator 82 receives row address strobe (RAS) signals on a line 94, column address strobe (CAS) signals on a line 98, and external address signals on a bus 102. Internal signal generator 82 provides the external address signals to multiplexer 86 through a bus 110. A mode control circuit 114, which may be a part of internal signal generator 82, determines whether DRAM 70 is in a normal (data reading or data writing) mode or in a refresh mode and provides address select signals to multiplexer 86 through a bus 118 and counter incrementing signals to counter 90 through a bus 122. Counter 90 provides a count value to multiplexer 86 through a bus 128. The count value functions as an address during refresh cycles, thus relieving the programmer of the duty of keeping track of which row to refresh. Multiplexer 86 thus provides the external address or the counter value to decode circuit 78 through a bus 132 in response to the address select signals received on line 118. Decode circuit 78 communicates with memory arrays 74A-P through corresponding buses 80A-P. The phantom line shown in FIG. 2 is not part of the prior art and will be discussed below.

FIG. 3A is a timing diagram showing a typical read cycle for obtaining data from DRAM 70. As usual, address multiplexing is employed to address the 4,194,304 memory cells in DRAM 70. That is, the 22-bit address is supplied in two groups of 11 bits each. Initially, the RAS signal goes low, and 11-bits of the external address (termed the "row address") are supplied on address bus 102 and latched in the DRAM. Thereafter, the CAS signal goes low, and the remaining 11 bits of the external address (termed the "column address") are supplied on address bus 102 to select one of the bit lines coupled to a selected word line. Since the column address has 11 bits, there must be $2^{11}$ bits of data to choose from. That is, at least 2048 separate bits must have been selected, sensed, and refreshed as a result of the RAS signal being activated. Thus, two word lines of 1024 bits each are selected by the row address, one in each of two of the memory arrays 74A-P. Write cycles are handled the same way.

FIG. 3B is a timing diagram showing one method for executing a refresh cycle. In this method, the CAS signal goes low before the RAS signal. Mode control circuit 114 detects the early CAS signal and generates a signal on line 118 so that multiplexer 86 provides the counter value (count N) as the row address to decode circuit 78. Decode circuit 78 decodes the counter value to activate 2 word lines, thus refreshing 2048 memory cells. Mode control circuit 114 also generates a signal on line 122 for incrementing (or decrementing) counter 90 (e.g., to count N+1). Typically, all memory cells are refreshed once every 16 milliseconds. Thus, as long as the programmer executes 2048 CAS-before-RAS cycles every 16 milliseconds, the DRAM will be fully and systematically refreshed, since the eleven-bit counter increments on each CAS-before-RAS refresh cycle. Of course, the programmer may forego the benefit of counter 90, systematically provide external addresses on address bus 102, and refresh DRAM 10 via 2048 normal read cycles every 16 milliseconds.

As technology advances, there is constant pressure to increase the number of normal read or write cycles available per unit of time to provide increased data flow. Accordingly, prior art DRAM's have been modified so that four word lines are activated per cycle (during both normal and refresh cycles) so twice as many memory cells (4096) are refreshed in every refresh cycle. Thus, only 1024 refresh cycles are needed every 16 milliseconds instead of 2048, allowing the DRAM to do useful read or write cycles during the time otherwise occupied by the extra refresh cycles. Unfortunately, almost twice as much power is consumed per cycle, and larger power supplies are needed. Furthermore, as memory speeds increase, the average power consumption becomes excessive, and the memory chips are unable to dissipate the heat without adding complex cooling systems.

SUMMARY OF THE INVENTION

The present invention is directed to a method and apparatus for refreshing a DRAM in a fraction of the time of known systems without consuming excessive power. Generally, the apparatus differentiates between a refresh mode and a normal mode and addresses a first number of rows of memory cells in the normal mode and a second, larger number or rows of memory cells in the refresh mode. In one embodiment of the present invention, an internal signal generator receives a row address strobe signal and a column address strobe signal. The internal signal generator generates a normal (e.g. read or write) mode signal when the row address strobe signal is received before the column address strobe signal is received. On the other hand, the internal signal generator generates a refresh mode signal when the row address strobe signal is received not before the column address strobe signal is received. A row addressing circuit addresses a first number of rows of data in response to the normal mode signal, and the row addressing circuit addresses a second number of rows of data in response to the refresh mode signal. The first number of rows is less than the second number of rows. For example while two word lines may be activated during each normal cycle, 4, 8, 16, etc., word lines may be activated during each refresh cycle.

DESCRIPTION OF THE PREFERRED EMBODIMENT

Figure 1:
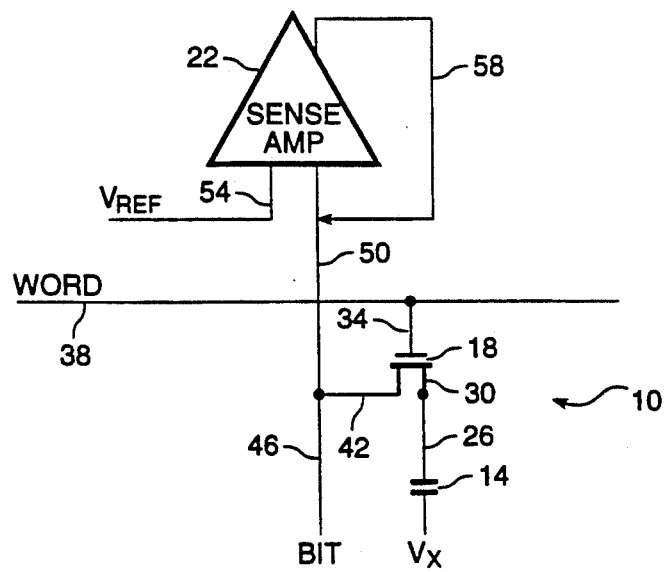
FIG. 1 is a schematic diagram of a known DRAM memory cell and sense amplifier.
Figure 2:
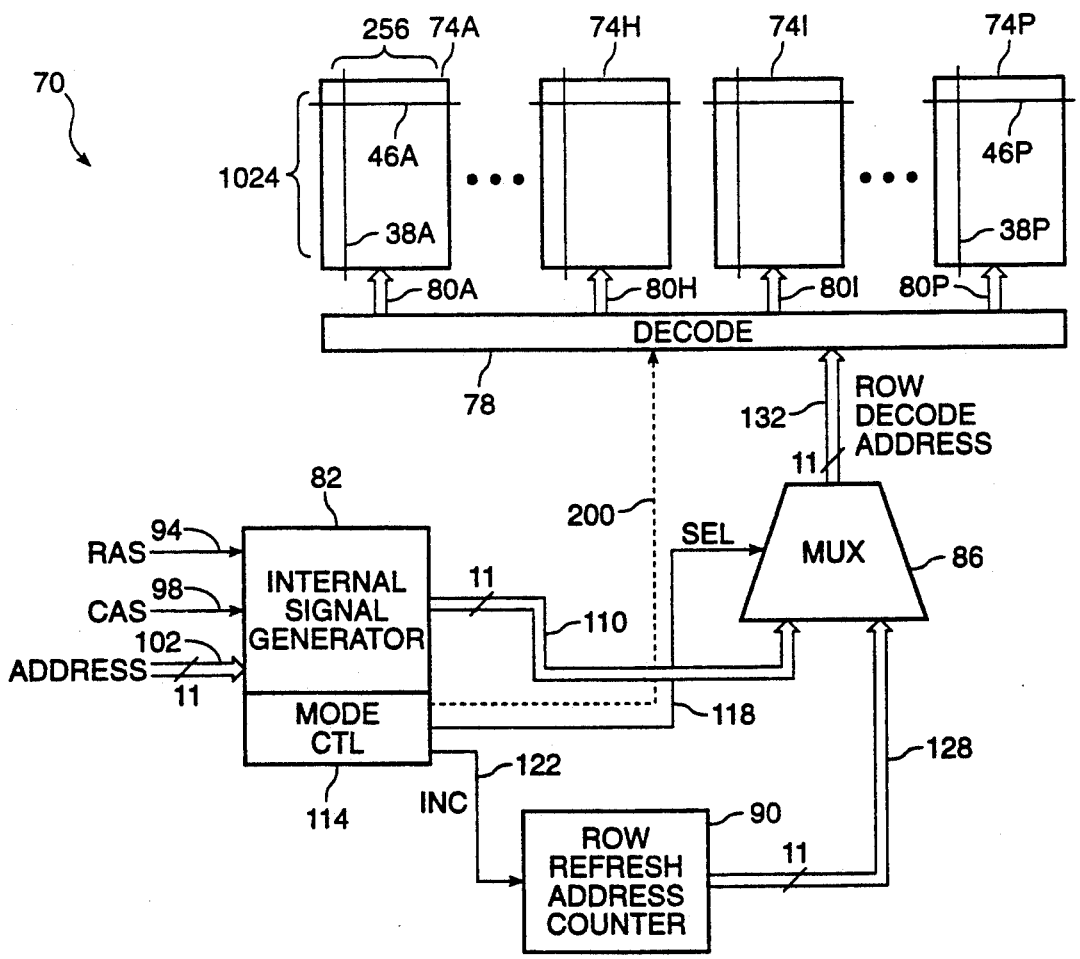
FIG. 2 is a block diagram of a known DRAM.
Figure 3A:
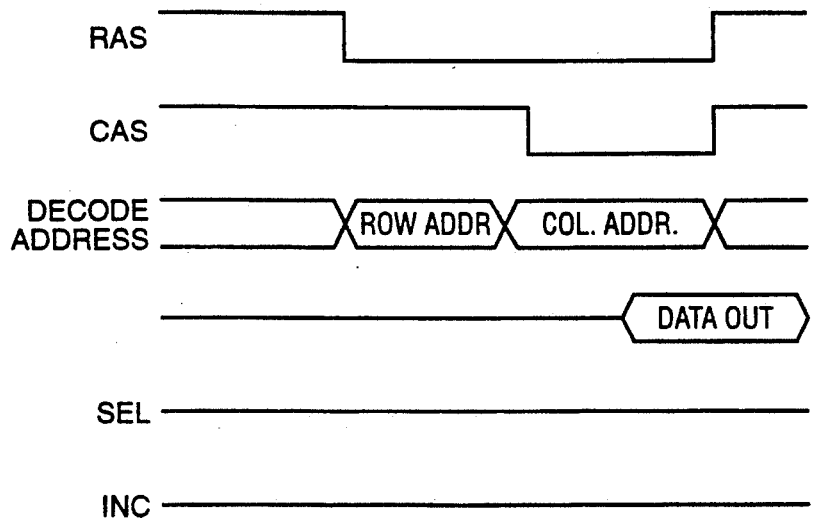
FIG. 3A is a timing diagram showing a typical read cycle for the DRAM shown in FIG. 2.
Figure 3B:
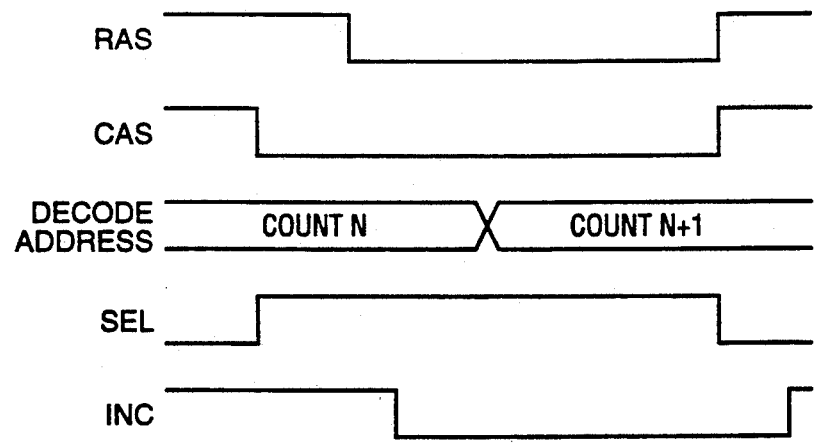
FIG. 3B is a timing diagram showing a typical refresh cycle for the DRAM shown in FIG. 2.
Figure 4:
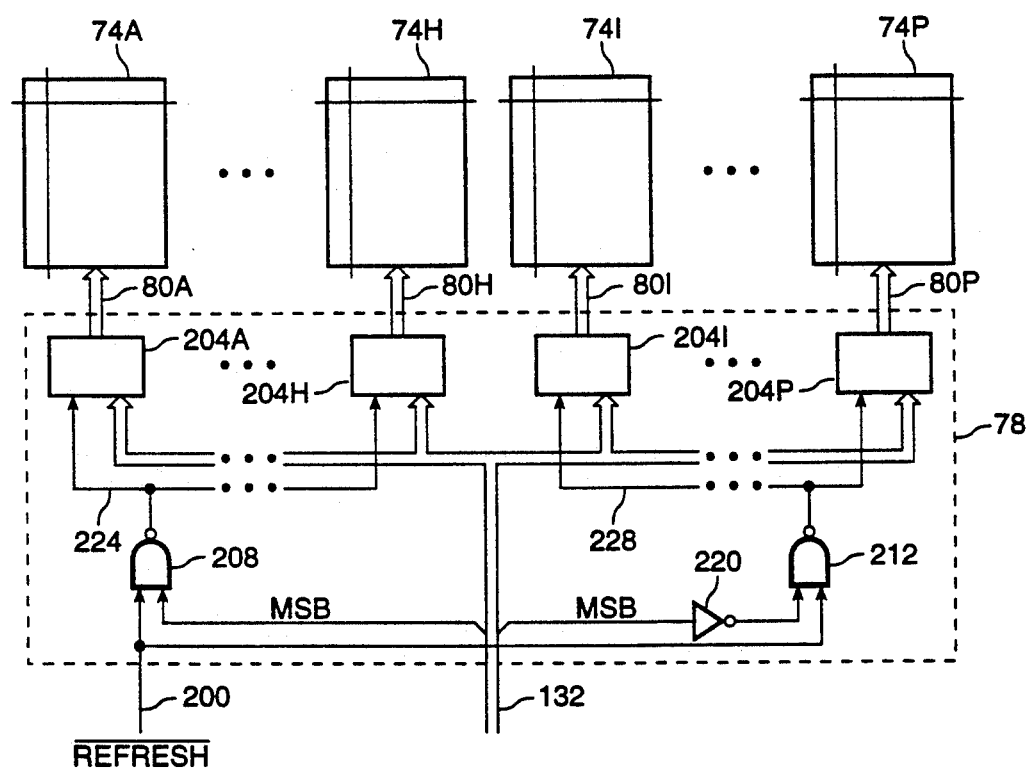
FIG. 4 is a block diagram of a particular embodiment of an apparatus for increasing the number of word lines activated during a refresh cycle for the DRAM shown in FIG. 1.

The present invention combines the advantage of decreased time used for refreshing a DRAM with the advantage of low average power consumption. It does this by increasing the number of word lines activatad during a refresh cycle compared to the number activated during a typical read or write cycle. To accomplish this, the prior art circuit shown in FIG. 2 is modified by adding a refresh line 200 from mode control circuit 114 to decode circuit 78, and decode circuit 78 may be constructed as shown in FIG. 4. In this embodiment, decode circuit 78 activates two word lines during every normal (read or write) cycle and four word lines during every refresh cycle.

As shown in FIG. 4, decode circuit 78 includes address decoders 204A-P, NAND gates 208 and 212, and inverter 220. Address decoders 204A-P are coupled to buses 80A-P for selecting one word line in each of two arrays (during a normal cycle) or one word line in each of four arrays (during a refresh cycle) in response to the address signals received through bus 132 from multiplexer 86. Additionally, address decoders 204A-H are coupled to an output terminal 224 of NAND gate 208, and address decoders 204I-P are coupled to an output terminal 228 of NAND gate 212. NAND gates 208 and 212 each have an input terminal coupled to refresh line 200. NAND gate 208 has another input terminal coupled for receiving the most significant bit of the row address received over bus 132. NAND gate 212 has another input terminal coupled to an output terminal of invertor 220 which, in turn, is coupled for receiving the most significant bit of the row address received over bus 132. NAND gates 208 and 212 thus control two logical banks of memory arrays comprising memory arrays 74A-H and 74I-P, respectively, and each bank activates word lines in zero or two arrays.

DRAM 70 functions the same way as discussed in the Background Of The Invention, but with the following additional features. During a normal cycle, mode control circuit 114 generates a logic "1" (normal mode) signal on refresh line 200 so that NAND gates 208 and 212 function as inverters. NAND gate 208 receives the most significant bit of the unaltered row address, whereas NAND gate 212 receives the inverted value of the most significant bit of the row address. Address decoders 204A-P use the most significant bit values received on output terminals 224 (inverted once) and 228 (inverted twice) together with the lesser significant bit values received over bus 132 for activating, e.g., two word lines from one of the banks of memory arrays 74A-H or 74I-P. Which bank is activated depends upon which NAND gate 208 or 212 generates the active output signal. For example, if the most significant bit of the row address is a "0," then NAND gate 208 generates a "1" for enabling address decoders 204A-H, and NAND gate 212 generates a "0" for disabling address decoders 204I-P. Two word lines are thus activated from among memory arrays 74A-H and zero lines are activated from among memory arrays 74I-P. On the other hand, if the most significant bit of the row address is a "1", two word lines are activated from among arrays 74I-P and zero lines are activated from among arrays 74A-H.

During a refresh cycle, mode control circuit 114 generates a low (refreshmode) signal on refresh line 200 so that both NAND gates 208 and 212 have a "1" on their output terminals 224 and 228, regardless of the value of the most significant bit of the row address. Since each address decoder 204A-P receives an activating signal, two word lines from among memory arrays 74A-H are activated, and two word lines from among memory arrays 74I-P are activated. Thus, two word lines are activated during a normal cycle, and a greater number, e.g., four word lines, are activated during a refresh cycle.

Assume all memory cells in DRAM 70 must be refreshed once every 16 milliseconds as discussed above. Since 1024 refresh cycles are needed (4096 memory cells per refresh cycle), one refresh cycle must be executed every approximately 16 microseconds. If each normal or refresh cycle lasts 0.1 microseconds, then 1 refresh cycle and 159 normal cycles may occur every 16 microseconds. Although each 4096 bit refresh cycle consumes twice as much power as each 2048 bit normal cycle, the extra power is largely hidden by the 159 low power normal cycles. That is, the refresh cycle contributes a minute fraction of extra power consumption to the average power consumption for the 16 microsecond interval. Thus, the advantage of fewer refresh cycles is realized without the excessive power consumption of known equivalent devices.

While the above is a complete description of a preferred embodiment of the present invention, various modifications may be employed. For example, any method of differentiating between normal and refresh cycles may be used to determine how many word lines to activate (e.g., single or multiple external signals applied to mode control circuit 114 or to the hardware within decode circuit 78). The present invention is not limited to the CAS-before-RAS method disclosed. Decode circuit 78 may be modified to selectively operate in either the prior art two-word line activating mode, the prior art four-word line activating mode, or one or more of the inventive $2^N$ word line activating modes. The normal mode signal may comprise one logic level on a single wire, and the refresh mode signal may comprise an opposite logic level on the same wire (as discussed herein), or the normal and refresh mode signals may comprise separate signals on separate wires. Consequently, the scope of the invention should be ascertained by the following claims.

What is claimed is:

1. An apparatus for refreshing a DRAM having a plurality of rows of memory cells comprising:
    cycle initiating means for initiating one of a normal cycle or a refresh cycle;
    mode control means, coupled to the cycle initiating means, for generating a normal mode signal when the normal cycle is initiated and for generating a refresh mode signal when the refresh cycle is initiated;
    row address means, coupled to the mode control means, for addressing a first number of rows of memory cells in response to the normal mode signal and for addressing a second number of rows of memory cells in response to the refresh mode signal;
    wherein the first number of rows is less than the second number of rows;
    row strobe receiving means for receiving a row address strobe signal;
    column strobe receiving means for receiving a column address strobe signal;
    wherein the mode control means is coupled to the row strobe receiving means and to the column strobe receiving means for generating the normal mode signal when the row address strobe signal is received before the column address strobe signal is received and for generating the refresh mode signal when the row address strobe signal is received not before the column address strobe signal is received;
    external address input means for receiving an external address;
    wherein the row address means is coupled to the external address input means for addressing the first number of rows of memory cells using the external address in response to the normal mode signal;
    wherein the mode control means generates an incrementing signal when the row address strobe signal is received not before the column address strobe signal is received; wherein the row address means further comprises a counter, coupled to the mode control means, for storing a counter value, the counter value being incremented in response to the incrementing signal; and wherein the second number of rows of data are addressed using the counter value as an address in response to the refresh mode signal.

2. The apparatus according to claim 1 wherein the second number is twice the first number.

3. The apparatus according to claim 1 wherein the second number divided by the first number equals $2^N$ where N is an integer greater than zero.

4. The apparatus according to claim 1 further comprising:
    a first NAND gate having a first input terminal coupled for receiving the refresh mode signal, a second input terminal coupled for receiving a most significant bit of the counter value, and an output terminal;
    a second NAND gate having a first input terminal coupled for receiving the refresh mode signal, a second input terminal coupled for receiving an inverted value of the most significant bit of the counter value, and an output terminal; and
    wherein the output terminal of the first NAND gate and the output terminal of the second NAND gate are coupled for addressing the second number of rows of data in response to the refresh mode signal.

5. An apparatus for refreshing a DRAM having a plurality of arrays of memory cells, each array having a plurality of word lines and a plurality of memory cells coupled to each word line comprising:
    cycle initiating means for initiating one of a normal cycle or a refresh cycle;
    mode control means, coupled to the cycle initiating means, for generating a normal mode signal when the normal cycle is initiated and for generating a refresh mode signal when the refresh cycle is initiated;
    array address means, coupled to the mode control means, for providing an activating signal to a first number of word lines in response to the normal mode signal and for providing the activating signal to a second number of word lines in response to the refresh mode signal;
    wherein the first number of word lines is less than the second number of word lines;
    row strobe receiving means for receiving a row address strobe signal;

column strobe receiving means for receiving a column address strobe signal;

wherein the mode control means is coupled to the row strobe receiving means and to the column strobe receiving means for generating the normal mode signal when the row address strobe signal is received before the column address strobe signal is received and for generating the refresh mode signal when the row address strobe signal is received not before the column address strobe signal is received;

external address input means for receiving an eternal address;

wherein the array address means is coupled to the external address input means for providing the activating signal to the first number of word lines using the external address in response to the normal mode signal;

wherein the mode control means generates an incrementing signal when the row-address strobe signal is received not before the column address strobe signal is received; wherein the array address means further comprises a counter, coupled to the mode control means, for storing a counter value, the counter value being incremented in response to the incrementing signal; and wherein the array address means provides the activating signal to the second number of word lines using the counter value as an address in response to the refresh mode signal.

6. The apparatus according to claim 5 wherein the second number is twice the first number.

7. The apparatus according to claim 5 wherein the second number divided by the first number equals $2^N$ where N is an integer greater than zero.

8. The apparatus according to claim 5 further comprising:
a first NAND gate having a first input terminal coupled for receiving the refresh mode signal, a second input terminal coupled for receiving a most significant bit of the counter value, and an output terminal;
a second NAND gate having a first input terminal coupled for receiving the refresh mode signal, a second input terminal coupled for receiving an inverted value of the most significant bit of the counter value, and an output terminal; and
wherein the output terminal of the first NAND gate and the output terminal of the second NAND gate are coupled for providing the activated signal to the second number of word lines in response to the refresh mode signal.

9. A method for refreshing a DRAM having a plurality of rows of memory cells comprising the steps of:
initiating one of a normal cycle or a refresh cycle;
generating a normal mode signal when a refresh cycle is initiated;
addressing a first number of rows of data in response to the normal mode signal;
addressing a second number of rows of data in response to the refresh mode signal;
wherein the first number of rows is less than the second number of rows;
receiving a row address strobe signal;
receiving a column address strobe signal;
wherein the normal mode signal generating step comprises the step of generating the normal mode signal when the row address strobe signal is received before the column address strobe signal is received;

wherein the refresh mode signal generating step comprises the step of generating the refresh mode signal when the row address strobe signal is received not before the column address strobe signal is received;
receiving an external address;
wherein the step of addressing the first number of rows of data comprises the step of addressing the first number of rows of data using the external address in response to the normal mode signal;
storing a counter value;
incrementing the counter value when the row address strobe signal is received not before the column address strobe signal is received; and
wherein the step of addressing the second number of rows comprises the step of addressing the second number of rows of data using the counter value as an address in response to the refresh mode signal.

10. The apparatus according to claim 9 wherein the second number is twice the first number.

11. The apparatus according to claim 9 wherein the second number divided by the first number equals $2^N$ where N is an integer greater than zero.

12. The method according to claim 9 further comprising the steps of:
receiving the refresh mode signal at a first input terminal of a NAND gate and at a first input terminal of a second NAND gate;
receiving a most significant bit of the counter value at a second input terminal of the first NAND gate;
receiving an inverted value of the most significant bit of the counter value at a second input terminal of the second NAND gate; and
wherein the step of addressing the second number of rows comprises the step of addressing the second number of rows of data using a signal from an output terminal of the first NAND gate and from an output terminal of the second NAND gate.

13. A method of refreshing a DRAM having a plurality of arrays of memory cells, each array having a plurality of word lines and a plurality of memory cells coupled to each word line comprising the steps of:
initiating one of a normal cycle or a refresh cycle;
generating a normal mode signal when a normal cycle is initiated;
generating a refresh mode signal when a refresh cycle is initiated;
providing an activating signal to a first number of word lines in response to the normal mode signal;
providing an activating signal to a second number of word lines in response to the refresh mode signal;
wherein the first number of word lines is less than the second number of word lines;
receiving a row address strobe signal;
receiving a column address strobe signal;
wherein the step of generating the normal mode signal comprises the step of generating the normal mode signal when the row address strobe signal is received before the column address strobe signal is received;
wherein the step of generating the refresh mode signal comprises the step of generating the refresh mode signal when the row address strobe signal is received not before the column address strobe signal is received;
receiving an external address;
wherein the step of providing the activating signal to the first number of word lines comprises the step of providing the activating signal to the first number of word lines using the external address in response to the normal mode signal;

storing a counter value;

incrementing the counter value when the row address strobe is received not before the column address strobe signal is received; and wherein the step of providing the activating signal to the second number of word lines comprises the step of providing the activating signal to the second number of word lines using the counter value as an address in response to the refresh mode signal.

14. The method according to claim 13 wherein the second number is twice the first number.

15. The method according to claim 13 wherein the second number divided by the first number equals $2^N$ where N is an integer greater than zero.

16. The method according to claim 13 further comprising the steps of:

receiving the refresh mode signal at a first input terminal of a NAND gate and at a first input terminal of a second NAND gate;

receiving a most significant bit of the counter value at a second input terminal of the first NAND gate;

receiving an inverted value of the most significant bit of the counter value at a second input terminal of the second NAND gate; and wherein the step of providing the activating signal to the second number of word lines comprises the step of providing the activating signal to the second number of word lines using a signal from an output terminal of the first NAND gate and from an output terminal of the second NAND gate.

* * * * *

UNITED STATES PATENT AND TRADEMARK OFFICE
CERTIFICATE OF CORRECTION

PATENT NO. : 5,305,274

DATED : April 19, 1994

INVENTOR(S) : Robert J. Proebsting

It is certified that error appears in the above-indentified patent and that said Letters Patent is hereby corrected as shown below:

Column 4, line 67, change "refreshmode" to --refresh mode--.

IN THE CLAIMS:

Column 7, line 55

Claim 9, line 4, before "refresh" insert --normal cycle is initiated; generating a refresh mode signal when a--.

Signed and Sealed this

Sixth Day of September, 1994

Attest:

BRUCE LEHMAN

Attesting Officer

Commissioner of Patents and Trademarks